United States Patent
Gitlin et al.

(12) 
(10) Patent No.: US 6,740,936 B1
(45) Date of Patent: May 25, 2004

(54) BALLAST RESISTOR WITH REDUCED AREA FOR ESD PROTECTION

(75) Inventors: Daniel Gitlin, Palo Alto, CA (US); James Karp, Saratoga, CA (US); Jongheon Jeong, Palo Alto, CA (US); Jan L. de Jong, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 14 days.

(21) Appl. No.: 10/134,086

(22) Filed: Apr. 25, 2002

(51) Int. Cl.[7] .............................. H01L 29/78
(52) U.S. Cl. ................ 257/363; 257/355; 257/356
(58) Field of Search .......................... 257/355, 356, 257/358, 363

(56) References Cited

U.S. PATENT DOCUMENTS 4,503,448 A * 3/1985 Miyasaka .................. 257/363
5,477,414 A 12/1995 Li et al.
6,054,736 A * 4/2000 Shigehara et al. .......... 257/363
6,229,183 B1 * 5/2001 Lee ............................ 257/363

OTHER PUBLICATIONS

"ESD In Silicon Integrated Circuits", Design and Measurement in Electronic Engineering, 1995 by, John Wiley & Sons Ltd, pp. 176–186.

* cited by examiner

*Primary Examiner*—Gene M. Munson
(74) *Attorney, Agent, or Firm*—Edel M. Young; Jeanette S. Harms

(57) ABSTRACT

A transistor with ballast resistor formed between the transistor drain and the drain contact is formed by masking regions of the ballast resistor to increase resistivity and thus reduce required area. The invention achieves this without introducing any additional process or masking steps. Thus the invention allows a reduction in IC die size for the same ESD requirement or allows better ESD protection for a given die size.

10 Claims, 1 Drawing Sheet

BALLAST RESISTOR WITH REDUCED AREA FOR ESD PROTECTION

FIELD OF THE INVENTION

The present invention relates to integrated circuits, in particular to electrostatic discharge (ESD) protection of the integrated circuit (IC).

BACKGROUND

ESD usually occurs during handling of IC devices, and consists of a very high positive or negative voltage being applied to an input/output pad of the IC device. The IC device must be protected from such events. In particular, the transistors of the IC, especially the thin gate oxides of the transistors, must be protected. As integrated circuit devices have become smaller, their tolerance of ESD events has become less. Thus, providing ESD protection has become more difficult. One kind of ESD protection device is a ballast resistor placed between a pad in the IC device and an input/output driver transistor that applies voltage to the pad or receives voltage from the pad. The fundamental problem with ballast resistors is that they consume significant silicon area. Since silicon area is the single most cost controlling element in IC production, there is a need to reduce silicon area.

FIG. 1 shows a side view cross section of a prior art transistor structure that includes a ballast resistor. A typical MOS transistor includes source region S, drain region D, separated by channel region C in the semiconductor substrate, over which is gate G. Source region S is contacted by contact N and drain region D is contacted by drain contact M. A lightly doped drain implant LDD is also applied to the source and drain regions to reduce current spiking at the junctions with the channel region. To form the ballast resistor 12, drain region D is extended, and contact M is separated from drain region D. Contact N and a contact at gate G (not shown) lead to other structures internal to the IC device, and contact M leads to an input/output pad of the IC device.

As discussed by Ajith Amerasekera and Charvaka Duvvury in "ESD in Silicon Integrated Circuits", © 1995 by John Wiley & Sons Ltd., at page 177, in a typical LDD structure, the LDD region is formed by phosphorus implantation with doses ranging from $10^{13}/cm^2$ to $10^{14}/cm^2$. It is also possible to use arsenic as the implant species for the LDD. As shown in FIG. 1, the LDD implant 11 is selfaligned to the edge of polysilicon gate G, migrating slightly beneath the edge. The main source/drain (S/D) implant usually consists of arsenic with doses in the $2 \times 10^{15}/cm^2$ to $5 \times 10^{15}/cm^2$ range. In order to ensure that the LDD region 11 is not overdosed by the S/D implant, the S/D implant is self-aligned to a spacer 13 deposited against the gate.

As integrated circuit devices shrink (channel lengths decrease, source and drain regions decrease, gate oxides become thinner, wires become narrower), one area that can not become smaller is the ballast resistor. For a given semiconductor process technology, the ballast resistor must remain of a size that it can dissipate heat generated by high currents resulting from the high voltage ESD event without being damaged and thus the ballast resistor has a minimum width. But in order to have sufficient resistance to limit ESD current, the ballast resistor must have sufficient length. Thus the ballast resistor becomes a limitation to further shrinking of the IC device.

It would be desirable to keep the ballast resistor at the minimum width defined by the heat dissipation limit and at the same time meet resistance requirements. It would also be desirable to accomplish this reduction without adding complication to the existing manufacturing process technology.

SUMMARY OF THE INVENTION

According to the invention, the resistivity of the ballast resistor is increased by changing the shape of a mask in order to prevent some of the doping of the ballast resistor region. As discussed above, a drain region is typically doped twice, once for a drain diffusion and once for a lightly doped drain implant. According to the invention, a portion of one of these dopings is blocked by one or more mask strips extending across a line between the drain and the drain contact.

In one embodiment, strips are placed in the mask for forming the drain region. In another embodiment, strips are placed in the mask for forming the lightly doped drain. In either embodiment, there may be one or more strips.

The invention increases resistivity of the ballast resistor region and thus allows for reducing the length of the ballast resistor without introducing any additional process or masking steps. Thus the invention allows a reduction in IC die size without any loss in ESD immunity, or allows better ESD protection for a given die size.

DETAILED DESCRIPTION

Figure 1:
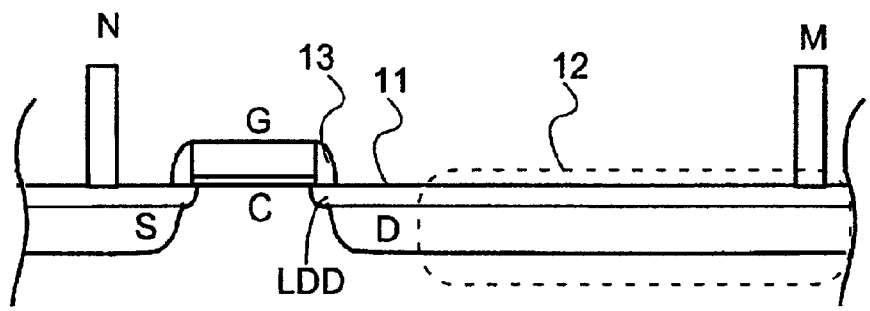
FIG. 1 shows a side cross section of a prior art transistor structure incorporating a ballast resistor.
Figure 2:
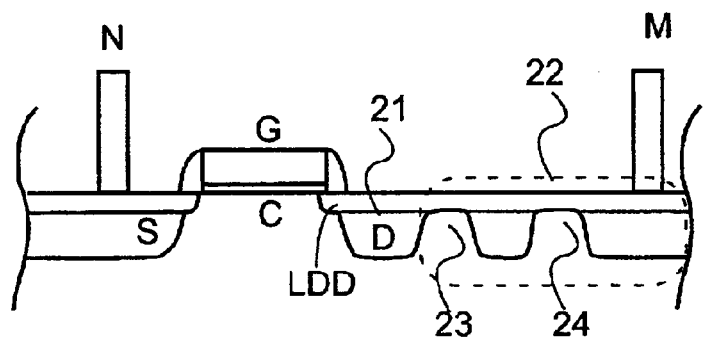
FIG. 2 shows a structure according to the invention in which mask strips have prevented source drain implant in parts of the ballast resistor.

FIG. 2 shows one embodiment of the invention in which portions of the source drain implant have been masked in the regions of the ballast resistor. Drain region D connects to drain contact M through a ballast resistor 22 formed from a continuous section of lightly doped drain implant and a discontinuous drain implant broken at regions 23 and 24 by a mask pattern that prevent the drain implant in these regions. The result is that the resistivity of the material (ohms per square) is increased in regions 23 and 24 so that the necessary resistance (ohms) is achieved in a shorter distance. Since resistance of the ballast resistor remains the same, the size reduction is achieved with no loss in ESD immunity of the structure. FIG. 2 has been deliberately drawn to show that ballast resistor 22 is shorter than prior art ballast resistor 12.

Figure 3:
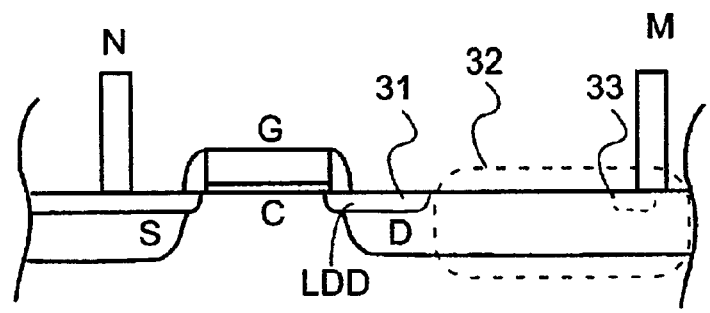
FIG. 3 shows a structure according to the invention in which mask strips have prevented lightly doped drain implant in parts of the ballast resistor.

FIG. 3 is another embodiment in which doping is inhibited in the region of the ballast resistor. In the case of FIG. 3, the lightly doped drain implant LDD is masked in the region of ballast resistor 32, so that the resistivity in region 32 is high enough to achieve sufficient resistance in a short distance.

Additional embodiments can also be understood from the above description. For example, although FIG. 2 shows two regions 23 and 24 that have been masked for higher resistivity, another number of regions can alternatively be formed. And whereas FIG. 3 shows one lightly doped drain region 31, another embodiment can be formed with periodic strips of LDD implant, for example optional LDD implant 33. In yet another embodiment, a ballast resistor is formed where each of the S/D and LDD implants are broken in at least one place but not both in the same place. Thus, a resistive path of high resistivity is formed between a drain and a drain contact.

What is claimed is:

1. A transistor with ballast resistor comprising:
   a substrate in which are formed a source and a drain, the source and drain being separated by a channel region;
   a gate positioned above and electrically separated from the channel region; and
   a drain contact electrically connected to the drain at a location separated from the channel region;
   wherein the ballast resistor is formed from a source/drain (S/D) implant and a lightly doped drain (LDD) implant formed on top of the S/D implant, the LDD implant being less doped than the S/D imDlant, the LDD implant extending continuously from the channel to the drain contact, and the S/D implant extending between the channel and the drain contact but being discontinuous in at least one place between the channel and the drain contact.

2. The transistor of claim 1 wherein a source contact is in contact with the source, and a gate contact is in contact with the gate, and wherein the drain contact is separated from the channel by a distance greater than a distance by which the source contact is separated from the channel.

3. The transistor of claim 2 wherein the S/D implant is discontinuous in two places.

4. A transistor with ballast resistor comprising:
   a substrate in which are formed a source and a drain, the source and drain being separated by a channel region;
   a gate positioned above and electrically separated from the channel region; and
   a drain contact electrically connected to the drain at a location separated from the channel region;
   wherein the ballast resistor is formed from a source/drain (S/D) implant and a lightly doped drain (LDD) implant formed on top of S/D implant, the LDD implant being less doped than the S/D implant, the LDD implant being discontinuous in at least one region between the channel and the drain contact, and the S/D implant extending continuously between the channel and the drain contact.

5. The transistor with ballast resistor of claim 4 wherein the LDD implant extends from the channel part of the way to the drain contact.

6. The transistor with ballast resistor of claim 4 wherein the LDD implant is formed in one piece.

7. The transistor with ballast resistor of claim 4 wherein the LDD implant is formed in two isolated sections.

8. A transistor with ballast resistor comprising:
   a substrate in which are formed a source and a drain, the source and drain being separated by a channel region;
   a gate positioned above and electrically separated from the channel region; and
   a drain contact electrically connected to the drain at a location separated from the channel region;
   wherein the ballast resistor is formed from a source/drain (S/D) implant and a lightly doped drain (LDD) implant formed on top of the S/D implant, the LDD implant being less doped than the S/D implant, wherein one of the LDD implant and the S/D implant is discontinuous in at least one region between the channel and the drain contact whereas the other is continuous.

9. An integrated circuit with ESD protection comprising:
   a plurality of pads;
   a plurality of ballast resistors, each ballast resistor connected at a first end to one of the pads and at a second end to a transistor, each ballast resistor being formed in a substrate region of the integrated circuit and comprising:
      a first imp ant and a second implant, the first implant being formed on top of the second implant, the first implant being continuous between the first and second ends, and the second implant being discontinuous between the first and second ends.

10. The integrated circuit of claim 9 wherein the first implant is a lightly doped drain (LDD) implant and the second implant is a source/drain (S/D) implant, the LDD implant being less doped than the S/D implant.

* * * * *